(12) United States Patent
Kidd et al.

(10) Patent No.: US 11,424,584 B2
(45) Date of Patent: Aug. 23, 2022

(54) CURRENT TRANSFORMER

(71) Applicant: GENERAL ELECTRIC TECHNOLOGY GMBH, Baden (CH)

(72) Inventors: Simon Kidd, Hixon (GB); Paul Aston, Kingston Hill (GB)

(73) Assignee: General Electric Technology Gmbh, Baden (CH)

( * ) Notice: Subject to any disclaimer, the term of this patent is extended or adjusted under 35 U.S.C. 154(b) by 398 days.

(21) Appl. No.: 16/612,247

(22) PCT Filed: Apr. 23, 2018

(86) PCT No.: PCT/EP2018/060346
§ 371 (c)(1),
(2) Date: Nov. 8, 2019

(87) PCT Pub. No.: WO2018/206284
PCT Pub. Date: Nov. 15, 2018

(65) Prior Publication Data
US 2020/0176975 A1 Jun. 4, 2020

(51) Int. Cl.
*H01R 31/08* (2006.01)
*G01R 31/52* (2020.01)
(Continued)

(52) U.S. Cl.
CPC ............ *H01R 31/08* (2013.01); *G01R 31/52* (2020.01); *H01R 12/721* (2013.01); *H02H 7/042* (2013.01); *H02H 7/045* (2013.01)

(58) Field of Classification Search
CPC .... G01R 31/52; H01R 12/721; H01R 12/735; H01R 12/737; H01R 31/08; H01R 13/24
(Continued)

(56) References Cited

U.S. PATENT DOCUMENTS 3,601,782 A * 8/1971 Gillissen .............. H01R 12/721
439/636
4,068,915 A * 1/1978 Evans .................. H01R 12/721
439/637
(Continued)

FOREIGN PATENT DOCUMENTS

| DE | 102010034863 A1 | 2/2012 |
| EP | 2530794 A1 | 12/2012 |
| JP | H08240612 A | 9/1996 |

OTHER PUBLICATIONS

International Search Report of PCT/EP2018/060346 dated Jun. 29, 2018.
(Continued)

*Primary Examiner* — Marcus E Harcum
(74) *Attorney, Agent, or Firm* — Eversheds Sutherland (US) LLP

(57) ABSTRACT

A current transformer connector (10; 102) for connecting a current transformer of an electrical network to a protection relay via a current transformer data acquisition board (12; 104), is provided. The current transformer connector (10; 102) comprises first and second pairs (14, 20) of first and second current contacts (16, 18, 22, 24), each current contact pair (14, 20) being connectable in use to the current transformer so as to permit current flow from the electrical network through the current contact pairs (14, 20) to the protection relay. Each current contact pair (14, 20) is arranged to be in a short circuit configuration. The first current contact (16, 22) in each current contact pair (14, 20) is arranged to be independently moveable relative to the corresponding second current contact (18, 24) so that during initial insertion of the current transformer data acquisition board (12; 104) into the current transformer connector (10; 102) in use the first current contact (16) of the first current contact pair (14) is configured to separate from the second
(Continued)

current contact (18) of the first current contact pair (14) to permit breaking of the short circuit configuration of the first current contact pair (14) and making of an electrical connection between the first current contact pair (14) and the current transformer data acquisition board (12; 104), while the second current contact pair (20) remains in the short circuit configuration. The first current contact (16, 22) in each current contact pair (14, 20) is further arranged to be independently moveable relative to the corresponding second current contact (18, 24) so that during further insertion of the current transformer data acquisition board (12; 104) into the current transformer connector (10; 102) in use the first current contact (22) of the second current contact pair (20) is configured to separate from the second current contact (24) of the second current contact pair (20) to permit breaking of the short circuit configuration of the second current contact pair (20).

15 Claims, 5 Drawing Sheets

(51) Int. Cl.
  H01R 12/72 (2011.01)
  *H02H 7/04* (2006.01)
  *H02H 7/045* (2006.01)

(58) Field of Classification Search
  USPC .................. 439/181, 637, 188, 511–513
  See application file for complete search history.

(56) References Cited

U.S. PATENT DOCUMENTS

| | | | | |
|---|---|---|---|---|
| 4,070,557 | A * | 1/1978 | Ostapovitch | H01R 13/629 361/787 |
| 4,087,151 | A * | 5/1978 | Robert | H01R 12/721 439/637 |
| 4,106,841 | A * | 8/1978 | Vladic | H01R 12/721 439/637 |
| 5,162,002 | A * | 11/1992 | Regnier | H01R 12/721 439/157 |
| 5,286,215 | A * | 2/1994 | Dewey | H01R 13/7037 439/59 |
| 5,582,519 | A | 12/1996 | Buchter | |
| 5,893,767 | A * | 4/1999 | Broschard, III | H01R 13/7033 439/668 |
| 6,123,553 | A * | 9/2000 | Kobayashi | H01R 13/7034 439/907 |
| 6,220,868 | B1 * | 4/2001 | Pei | H01R 12/721 439/60 |
| 6,247,948 | B1 * | 6/2001 | Davis | H01R 13/701 200/51.09 |
| 6,375,483 | B1 * | 4/2002 | Chang | H01R 12/7094 439/64 |
| 6,488,549 | B1 * | 12/2002 | Weller | H01R 13/6485 439/856 |
| 6,764,345 | B1 * | 7/2004 | Duesterhoeft | H01R 12/721 439/637 |
| 6,923,655 | B2 * | 8/2005 | Korsunsky | H01R 12/85 439/637 |
| 7,029,285 | B2 * | 4/2006 | Abe | H01R 12/7094 439/62 |
| 7,172,444 | B1 * | 2/2007 | Huang | H01R 13/2442 439/260 |
| 7,628,654 | B2 * | 12/2009 | Hori | H01R 13/5205 439/637 |
| 7,850,471 | B2 * | 12/2010 | Imai | H01R 13/7032 200/51.1 |
| 8,246,358 | B2 * | 8/2012 | Molnar | H01R 12/7094 439/59 |
| 8,602,801 | B2 * | 12/2013 | Sylvester | H01R 13/7031 439/188 |
| 8,961,208 | B2 * | 2/2015 | Bentler | H01R 9/2666 439/716 |
| 8,986,043 | B2 * | 3/2015 | Hirakawa | H01R 9/05 439/63 |
| 9,004,924 | B2 * | 4/2015 | Kuo | H01R 13/6205 439/39 |
| 9,716,333 | B1 * | 7/2017 | Hu | H01R 13/115 |
| 2003/0054683 | A1 * | 3/2003 | Bryan | H01R 13/66 439/181 |
| 2004/0266268 | A1 * | 12/2004 | Arias | H04Q 1/142 439/637 |
| 2005/0042928 | A1 * | 2/2005 | Yi | H01R 12/721 439/637 |
| 2006/0128194 | A1 * | 6/2006 | Wang | H01R 13/7031 439/188 |
| 2007/0264854 | A1 * | 11/2007 | Sasaki | H01R 13/20 439/188 |
| 2012/0293019 | A1 * | 11/2012 | Tajima | H01R 13/7036 307/147 |
| 2014/0206216 | A1 * | 7/2014 | Huang | H01R 24/46 439/188 |
| 2014/0273649 | A1 * | 9/2014 | Smith | H01R 31/08 439/638 |
| 2014/0295680 | A1 | 10/2014 | Yuqiang et al. | |
| 2015/0171571 | A1 * | 6/2015 | MacDougall | H01R 13/7032 439/188 |
| 2016/0006188 | A1 * | 1/2016 | Chang | H01R 12/724 439/188 |
| 2016/0291058 | A1 | 10/2016 | Ostmeier | |
| 2017/0093087 | A1 * | 3/2017 | Esmaeili | H01R 13/6205 |

OTHER PUBLICATIONS

European Search Report for Application No. 17170468.7 dated Oct. 16, 2017.

* cited by examiner

CURRENT TRANSFORMER

CROSS-REFERENCE TO RELATED APPLICATIONS

This application is a U.S. National Stage Application under 35 U.S.C. 371 and claims the priority benefit of International Application No. PCT/EP2018/060346 filed Apr. 23, 2018, which claims priority to EP17170468.7, filed May 10, 2017, which are both incorporated herein by reference.

This invention relates to a current transformer connector and a current transformer connection assembly.

It is known to use a protection relay to protect a section of an electrical network. Moreover, it is known to take current measurements of the electrical network using a current transformer and feed the measurements to the protection relay so as to permit the protection relay to sense a fault on the electrical network.

According to a first aspect of the invention there is provided a current transformer connector for connecting a current transformer of an electrical network to a protection relay via a current transformer data acquisition board, the current transformer connector comprising first and second pairs of first and second current contacts, each current contact pair being connectable in use to the current transformer so as to permit current flow from the electrical network through the current contact pairs to the protection relay, wherein each current contact pair is arranged to be in a short circuit configuration, and wherein the first current contact in each current contact pair is arranged to be independently moveable relative to the corresponding second current contact so that during initial insertion of the current transformer data acquisition board into the current transformer connector in use the first current contact of the first current contact pair is configured to separate from the second current contact of the first current contact pair to permit breaking of the short circuit configuration of the first current contact pair and making of an electrical connection between the first current contact pair and the current transformer data acquisition board while the second current contact pair remains in the short circuit configuration, and so that during further insertion of the current transformer data acquisition board into the current transformer connector in use the first current contact of the second current contact pair is configured to separate from the second current contact of the second current contact pair to permit breaking of the short circuit configuration of the second current contact pair.

The current transformer connector receives, in use, the current transformer data acquisition board to permit current to flow from the current transformer of the electrical network (i.e. a "primary" current transformer) through the first and second current contact pairs to the current transformer data acquisition board, which forms part of a protection relay.

In such an arrangement, it is imperative that the current transformer connection is never in an open circuit configuration when current is flowing, and so a current path for the current transformer current must always exist (a feature known as "current transformer shorting").

The current contact pairs of the invention being arranged to be in the short circuit configuration means that there is a current path for the current transformer current when there is no current transformer data acquisition board present to connect the current transformer to a burden (e.g. a protection relay).

Meanwhile, the first current contact in each current contact pair being arranged to be independently moveable in the manner set out above means that during the initial insertion of the current transformer data acquisition board the short circuit configuration of the first current contact pair is broken and an electrical connection between the first current contact pair and the current transformer data acquisition board is made independently of the second current contact pair which remains in the short circuit configuration. Moreover, the short circuit configuration of the second current contact pair is broken, thus breaking the current transformer shorting, during the further insertion of the current transformer data acquisition board.

As a result, one of the current contact pairs makes an electrical connection before the current transformer shorting is broken, thus always providing a current path for the current transformer current before and during insertion of the current transformer data acquisition board.

The current contact pairs therefore provide a make-before-break functionality.

It is the current contact pairs themselves (i.e. the same current contact pairs that permit the flow of current from the current transformer to the current transformer data acquisition board) that provide the short circuit functionality and the make-before-break functionality, thus obviating the need for additional components to provide such functionalities. Accordingly, the cost, development time and assembly time of the current transformer connector is reduced.

Preferably the first current contact in each current contact pair may be arranged to be independently moveable relative to the corresponding second current contact so that during initial removal of the current transformer data acquisition board from the current transformer connector in use the first current contact of the second current contact pair is configured to return to the short circuit configuration while the first current contact pair remains in electrical connection with the current transformer data acquisition board, and so that during further removal of the current transformer data acquisition board from the current transformer connector in use the first current contact of the first current contact pair is configured to return to the short circuit configuration.

The first current contact in each current contact pair being so arranged ensures that the second current contact pairs are in the short circuit configuration before the current transformer data acquisition board is fully removed from the current transformer connector thus resulting in the current contact pairs no longer being connected to a burden (e.g. the protection relay).

As such, the arrangement of the current contact pairs ensures that there is always a current path for the current transformer current during and after removal of the current transformer data acquisition board.

The first current contact in each current contact pair may be biased towards the corresponding second current contact so that the first and second current contacts in each current contact pair are in contact with one another in the short circuit configuration.

The first current contact in each current contact pair being biased towards the corresponding second current contact means that the default position of the current contact pairs is the short circuit configuration.

Optionally the second current contact in each current contact pair is also biased towards the corresponding first current contact.

Arranging both of the first and second current contacts in each current contact pair to be biased towards one another increases the contact force between each current contact pair, thus providing a reliable short circuit functionality.

Preferably the first current contact in the first current contact pair may be arranged to be urged away from and break contact with the corresponding second current contact so as to break the short circuit configuration during initial insertion of the current transformer data acquisition board into the current transformer connector in use and/or the first current contact in the second current contact pair may be arranged to be urged away from and break contact with the corresponding second current contact so as to break the short circuit configuration of the second current contact pair during further insertion of the current transformer data acquisition board into the current transformer connector in use.

Such an arrangement means that the first current contact is pushed away by the current transformer data acquisition board during insertion so as to physically break the short circuit configuration of the first and/or second current contact pairs as desired.

In an embodiment of the invention, the second current contact in each current contact pair may be arranged to be independently moveable relative to the corresponding first current contact so that during the initial insertion of the current transformer data acquisition board the second current contact of the first current contact pair is configured to separate from the first current contact of the first current contact pair to permit breaking of the short circuit configuration of the first current contact pair and making of an electrical connection between the first current contact pair and the current transformer data acquisition board while the second current contact pair remains in the short circuit configuration, and so that during the further insertion of the current transformer data acquisition board the second current contact of the second current contact pair is configured to separate from the first current contact of the second current contact pair to permit breaking of the short circuit configuration of the second current contact pair.

Arranging the second current contact in each current contact pair in this manner improves the breaking of the short circuit configuration as desired during insertion of the current transformer data acquisition board since both of the first and second current contacts in each current contact pair is moveable.

Moreover, in such an arrangement, the second current contact in the first current contact pair may be arranged to be urged away from and break contact with the corresponding first current contact so as to break the short circuit configuration during initial insertion of the current transformer data acquisition board into the current transformer connector in use and/or the second current contact in the second current contact pair may be arranged to be urged away from and break contact with the corresponding first current contact so as to break the short circuit configuration of the second current contact pair during further insertion of the current transformer data acquisition board into the current transformer connector in use.

The first current contact in the second current contact pair may be arranged to be independently moveable relative to the corresponding second current contact so that the first current contact in the second current contact pair permits making of an electrical connection between the second current contact pair and the current transformer data acquisition board during the further insertion of the current transformer data acquisition board.

Such an arrangement permits a good and reliable electrical contact of the current transformer data acquisition board across all of the current contact pairs once the current transformer data acquisition board is further inserted into the current transformer connector.

Optionally the current transformer connector includes a plurality of first current contact pairs and/or a plurality of second current contact pairs.

According to a second aspect of the invention there is provided a current transformer connection assembly for connecting a current transformer of an electrical network to a protection relay, the current transformer connection assembly comprising:
  a current transformer connector as described hereinabove; and
  a current transformer data acquisition board including a current channel member arranged to be selectively inserted into the current transformer connector to permit, in use, current flow from the electrical network through the current channel member to the protection relay, the current channel member further being shaped so that during initial insertion of the current channel member into the current transformer connector the current channel member separates the first current contact of the first current contact pair from the second current contact of the first current contact pair to break the short circuit configuration of the first current contact pair and make an electrical connection between the first current contact pair and the current channel member while the second current contact pair remains in the short circuit configuration, and so that during further insertion of the current channel member into the current transformer connector the current channel member separates the first current contact of the second current contact pair from the second current contact of the second current contact pair to break the short circuit configuration of the second current contact pair.

The advantages of the current transformer connector of the first aspect of the invention and its embodiments applies mutatis mutandis to the corresponding part of the second aspect of the invention and its embodiments.

Meanwhile, the current transformer data acquisition board having a current channel member shaped in the manner set out above means that the current transformer data acquisition board itself permits the make-before-break functionality provided by the current contact pairs as the current channel member is inserted into the current transformer connector.

Preferably the current channel member may be arranged to be selectively removed from the current transformer connector, the current channel member being shaped so that during initial removal of the current channel member from the current transformer connector the first current contact of the second current contact pair returns to the short circuit configuration while the first current contact pair remains in electrical connection with the current channel member, and so that during further removal of the current channel member from the current transformer connector the first current contact of the first current contact pair returns to the short circuit configuration.

The current transformer data acquisition board having a current channel member shaped in this manner ensures that there is always a current path for the current transformer current during and after removal of the current channel member.

Optionally the current channel member is shaped to urge the first current contact in the first current contact pair away from and break contact with the corresponding second current contact so as to break the short circuit configuration during the initial insertion of the current channel member and the current channel member is shaped to urge the first current contact in the second current contact pair away from and break contact with the corresponding second current contact so as to break the short circuit configuration during the further insertion of the current channel member.

Such an arrangement means that the current channel member pushes the first current contact away from the corresponding second current contact during insertion so as to physically break the short circuit configuration of the first and second current contact pairs as desired.

In an embodiment of the invention wherein the second current contact is also arranged to be independently moveable relative to the corresponding first current contact, the current channel member may be shaped to urge the second current contact in the first current contact pair away from and break contact with the corresponding first current contact so as to break the short circuit configuration during the initial insertion of the current channel member and the current channel member may be shaped to urge the second current contact in the second current contact pair away from and break contact with the corresponding first current contact so as to break the short circuit configuration during the further insertion of the current channel member.

Preferably the current channel member may extend from an edge of the current transformer data acquisition board and lie in the same plane as the current transformer data acquisition board.

The current transformer data acquisition board being shaped in this manner makes use of the fact that the current transformer data acquisition board can readily be pressed, stamped or cut with an edge profile that permits the aforementioned make-before-break feature when the current channel member is inserted into the current transformer connector.

In some embodiments of the invention, the current channel member may be symmetrical about the centre line of the current channel member.

The current channel member being symmetrical about its centre provides balanced insertion and/or extraction forces to the current contact pairs.

Optionally the current channel member includes first and second current channel member portions positioned relative to one another so that the first current channel member portion enters first into the current transformer connector during the initial insertion so as to break the short circuit configuration of the first current contact pair and make the electrical connection between the first current contact pair and the current channel member, and so that the second current channel member portion enters second into the current transformer connector during the further insertion so as to break the short circuit configuration of the second current contact pair.

The current channel member having such current channel member portions provides the shape of the current channel member which permits the make-before-break functionality when the current channel member is being both inserted and removed from the current transformer connector.

The first current channel member portion may extend from the second current channel member portion at a centre portion of the second current channel member portion.

Such an arrangement ensures an even force is applied by the first current channel member portion onto the current contact pairs as the first current channel member portion is inserted into the current transformer connector.

It will be appreciated that the use of the terms "first" and "second", and the like, in this patent specification is merely intended to help distinguish between similar features (e.g. the first and second current contact pairs), and is not intended to indicate the relative importance of one feature over another feature, unless otherwise specified.

Preferred embodiments of the invention will now be described, by way of non-limiting examples, with reference to the accompanying drawings in which:

FIG. 3b shows a current connector member portion of the current connector member shown in FIG. 3a;

Figure 1:
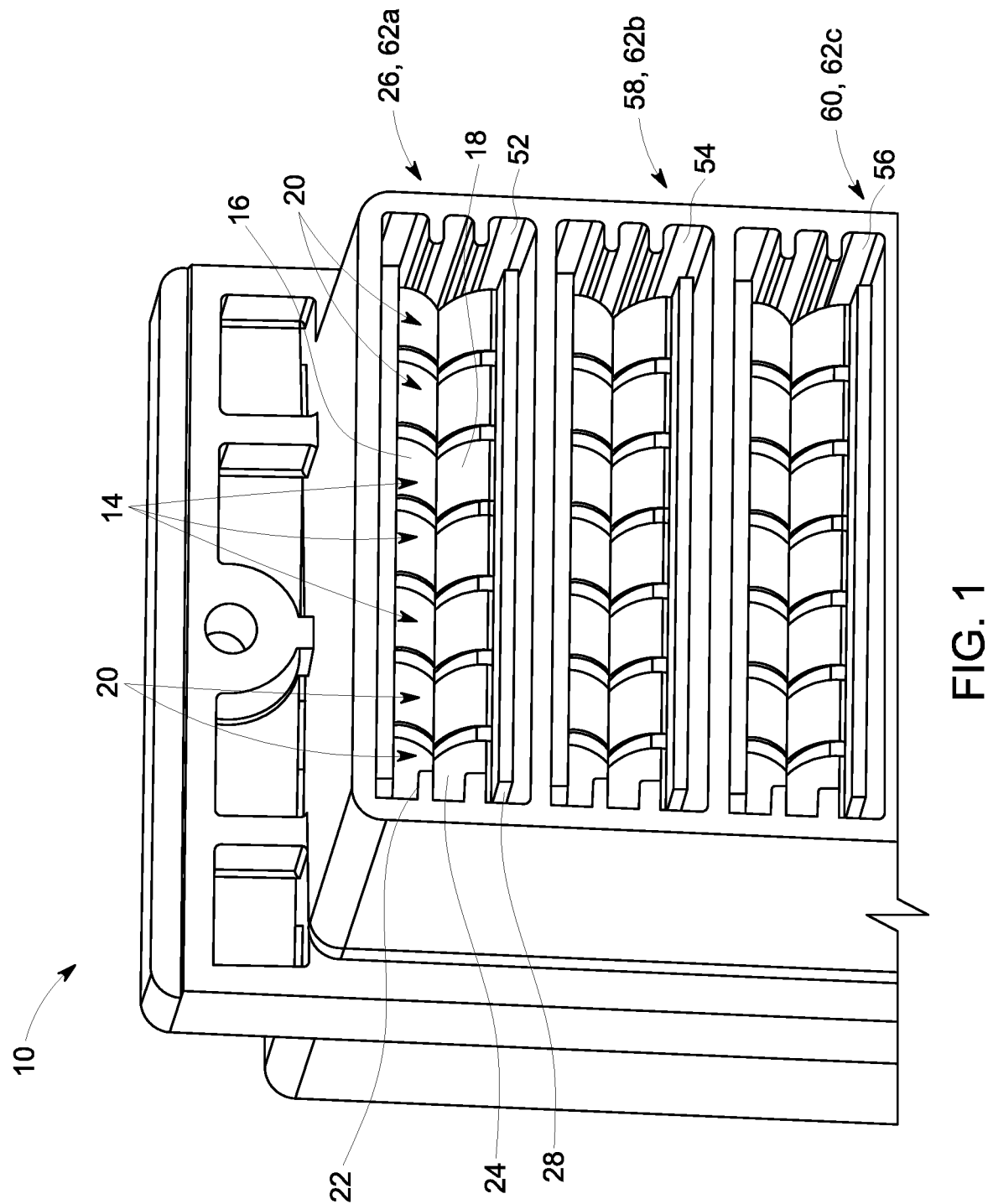
FIG. 1 shows a current transformer connector according to a first embodiment of the invention.

A current transformer connector according to the first embodiment of the invention is shown in FIGS. 1 to 3b and is designated generally by reference numeral 10.

The current transformer connector 10 is connected in use to a current transformer (not shown) of an electrical network (not shown). The current transformer connector 10 is also connected in use to a current transformer data acquisition board 12 which is inserted into the current transformer connector 10 so as to connect the current transformer to a protection relay (not shown).

The current transformer connector 10 includes a plurality of first current contact pairs 14, each first current contact pair 14 including first and second current contacts 16, 18, and a plurality of second current contact pairs 20, each second current contact pair 20 including first and second current contacts 22, 24. The current contact pairs 14, 20 are positioned in a row to form a first set 26 of contacts, but may be positioned in a column depending on the orientation of the current transformer connector 10. Each current contact pair 14, 20 is connectable in use to the current transformer.

In the embodiment shown, the current transformer connector 10 includes a total of seven current contact pairs 14, 20 made up of three first current contact pairs 14 and four second current contact pairs 20. Moreover, the first current contact pairs 14 are positioned at the centre of the row of current contact pairs 14, 20 with two pairs of second current contact pairs 20 being positioned at each side of the first current contact pairs 14.

In other embodiments of the invention, the current transformer connector 10 may instead include any number of first and second current contact pairs 14, 20. In further embodiments of the invention, the positioning of the current contact pairs 14, 20 may differ from that shown in the figures. For example, the or each first current contact pair 14 may be positioned at the outer of the first set 26 of contacts with the or each second current contact pair 20 being positioned at the centre of the first set 26. Alternatively, the or each first current contact pair 14 may be positioned at one side of the first set 26 of contacts with the or each second current contact pair 20 being positioned at the other side of the first set 26.

The current contact pairs 14, 20 are described in more detail below with reference to FIGS. 2a, 2b and 2c. It is noted that FIGS. 2a, 2b and 2c show only one first current contact pair 14 and one second current contact pair 20 for illustrative purposes.

Figure 2A:
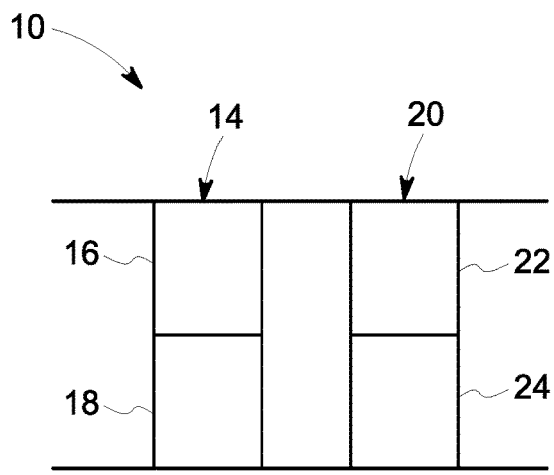
FIG. 2a shows a schematic view of first and second current contact pairs in a short circuit configuration.
Figure 2B:
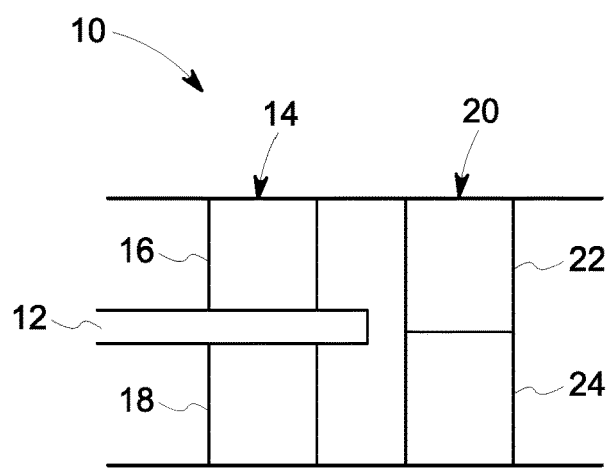
FIG. 2b shows a schematic view of the first and second current contact pairs in a make configuration.
Figure 2C:
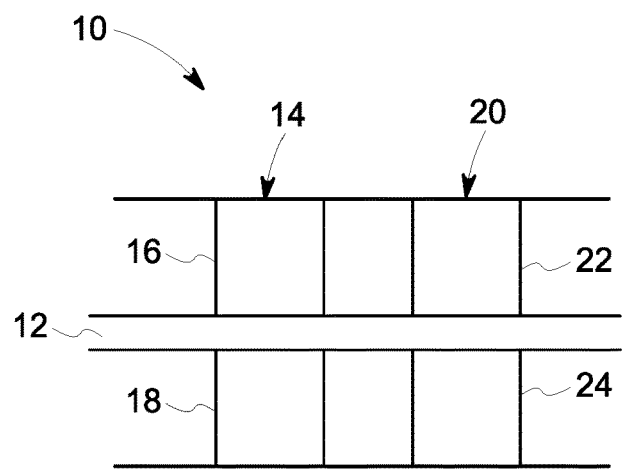
FIG. 2c shows a schematic view of the first and second current contact pairs in a break configuration.

Each current contact pair 14, 20 is arranged to be in a short circuit configuration, as shown in FIG. 2a. In the short circuit configuration, the first and second current contacts 16, 18 of the first current contact pair 14 are in contact with one another (i.e. are touching one another) and the first and second current contacts 22, 24 of the second current contact pair 20 are in contact with one another (i.e. are touching one another).

The first current contact 16, 22 in each current contact pair 14, 20 is arranged to be independently moveable relative to the corresponding second current contact 18, 24 and the second current contact 18, 24 in each current contact pair 14, 20 is arranged to be independently moveable relative to the corresponding first current contact 16, 22.

The first and second current contacts 16, 18, 22, 24 in each current contact pair 14, 20 are so moveable so that during initial insertion of the current transformer data acquisition board 12 into the current transformer connector 10 in use the first and second current contacts 16, 18, of the first current contact pair 14 are configured to separate from one another, in particular be urged away from one another, to permit breaking of the short circuit configuration of the first current contact pair 14 and making of an electrical connection between the first current contact pair 14 and the current transformer data acquisition board 12, while the second current contact pair 20 remains in the short circuit configuration. In this way, one, or some, (but not all) of the current contact pairs 14 have made an electrical connection with the current transformer data acquisition board 12 while the remaining current transformer pairs 20 continue to be in the short circuit configuration, and so the current contact pairs 14, 20 are in a "make" configuration, as shown in FIG. 2b.

The first and second current contacts 16, 18, 22, 24 in each current contact pair 14, 20 are also so moveable so that during further insertion of the current transformer data acquisition board 12 into the current transformer connector 10 in use the first and second current contacts 22, 24 of the second current contact pair 20 are configured to separate from one another, in particular be urged away from one another, to permit breaking of the short circuit configuration of the second current contact pair 20. In this way, all the current contact pairs 14, 20 have broken their short circuit configuration and so the current contact pairs 14, 20 are in a "break" configuration, as shown in FIG. 2c.

The first and second current contacts 16, 18, 22, 24 are also independently moveable so that during initial removal of the current transformer data acquisition board 12 from the current transformer connector 10 in use the current contacts 22, 24 of the second current contact pair 16 are configured to return to the short circuit configuration while the first contact pair 14 remains in electrical connection with the current transformer data acquisition board 12 (as shown in FIG. 2b). Moreover, the first and second current contacts 16, 18 of the first current contact pair 14 are independently moveable so that during further removal of the current transformer data acquisition board 12 from the current transformer connector 10 in use the current contacts 16, 18 of the first current contact pair 14 are configured to return to the short circuit configuration (as shown in FIG. 2a).

In particular, the first and second current contacts 14, 16 of the first current contact pair 14 are biased towards one another and the first and second current contacts 22, 24 of the second current contact pair 20 are biased towards one another.

The first and second current contacts 22, 24 of the second current contact pair 20 are also arranged to be independently moveable relative to one another so that the current contacts 22, 24 in the second current contact pair 20 make an electrical connection between the second current contact pair 20 and the current transformer data acquisition board 12 during further insertion of the current transformer data acquisition board 12. In this way, all of the current contact pairs 14, 20 are configured to make an electrical connection with the current transformer data acquisition board 12 in the "break" configuration (shown in FIG. 2c).

In other embodiments of the invention, only one of the first and second current contacts 16, 18, 22, 24 in each current contact pair 14, 20 may be independently moveable while the other current contact in that current contact pair is stationary. For example, the first current contact 16 of the first current contact pair 14 may be moveable relative to a stationary second current contact 18 of the first current contact pair 14.

In further embodiments of the invention, only one of the first and second current contacts 14, 16, 22, 24 in each current contact pair 14, 20 may be biased towards to the other corresponding current contact.

The current transformer connector 10 further includes a current connector member 28 which supports the current contact pairs 14, 20. The current connector member 28, as shown in more details in FIG. 3a, includes first and second current connector member portions 30, 32 each of which includes a respective current terminal 34, 36 secured thereto which is connectable to a respective pole of the current transformer.

The first current connector member portion 30 supports the first current contacts 16, 22 of both the first and second current contact pairs 14, 20, while the second current connector member portion 32 supports the second current contacts 18, 24 of both the first and second current contact pairs 14, 20.

More specifically, the first current contacts 16, 22 are formed from a single first current contact member 38 which includes seven fingers 40 to form the independently moveable first current contacts 16, 22. Similarly, the second current contacts 18, 24 are formed from a single second current contact member 42 which includes seven fingers 40 to form the independently moveable second current contacts 18, 24.

The fingers 40 are formed such that the first and second current contact members 38, 42 are spring contacts.

The first current connector portion 30 and first current contact member 38 are described in more detail below with reference to FIG. 3b. It will be understood that the features described apply mutatis mutandis to the second current connector portion 32 and the second current contact member 42.

In the embodiment shown, the first current contact member 38 includes a first contact portion 44 and a second contact portion 46. The first contact portion 44 is in contact with the first current connector member portion 30. Indeed, the first contact portion 44 is secured, e.g. by a snap-fit arrangement, to the first current connector member portion 30. The first contact portion 44 is substantially flat so that it lies flat on top of a surface of the first current connector member portion 30. The first contact portion 44 may take any other form which permits it to be secured to the first current connector member portion 30.

The second contact portion 46 extends from the first contact portion 44 to form the fingers 40. The second contact portion 46 is in contact with the first current member portion 30 and the second contact portion 46 of the second current contact member 42 (i.e. the second current contacts 18, 24 in the current contact pairs 14, 20).

In the embodiment shown, the second contact portion 46 has an arcuate profile, the crest 48 of which extends away from the first current connector member portion 30. The second contact portion 46 therefore extends from the first contact portion 44 (which is in contact with the first current member portion 30), away from the first current member portion 30 to reach the crest 48 of the arcuate profile, and back towards the first current member portion 30 to be in contact with the first current member portion 30.

It is therefore the crests 48 of the arcuate profiles of the first and second current contact members 38, 42 that touch one another when the current contact pairs 14, 20 are in the short circuit configuration.

In other embodiments of the invention the first and second current contact members 38, 42 may take another shape.

The first and second contact members 38, 42 are formed from metal with the properties and/or dimensions to permit the fingers 40 to be independently moveable upon insertion of the current transformer data acquisition board 12.

The first and second current contact member portions 30, 32 are formed separately from one another. In particular, the first and second current contact member portions 30, 32 are formed from separate pieces of metal, such as copper.

The current terminals 34, 36 are tapped with M4 threads so that they are configured to accept M4 screws. This allows the current terminals 34, 36 to be able to receive external wiring from the current transformer. The current terminals 34, 36 are fixedly secured to a terminal portion 50 of the corresponding first and second current contact member portions 30, 32.

Figure 3A:
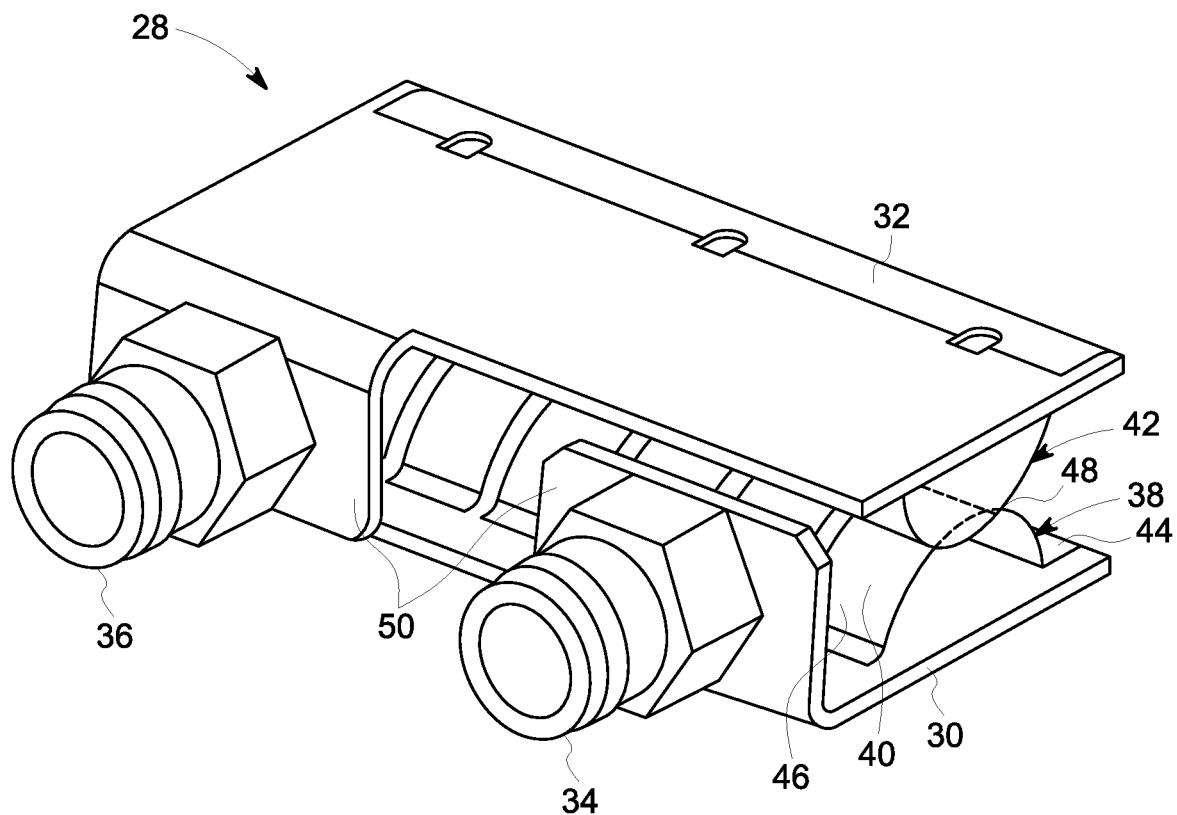
FIG. 3a shows a current connector member of the current transformer connector shown in FIG. 1.
Figure 3B:
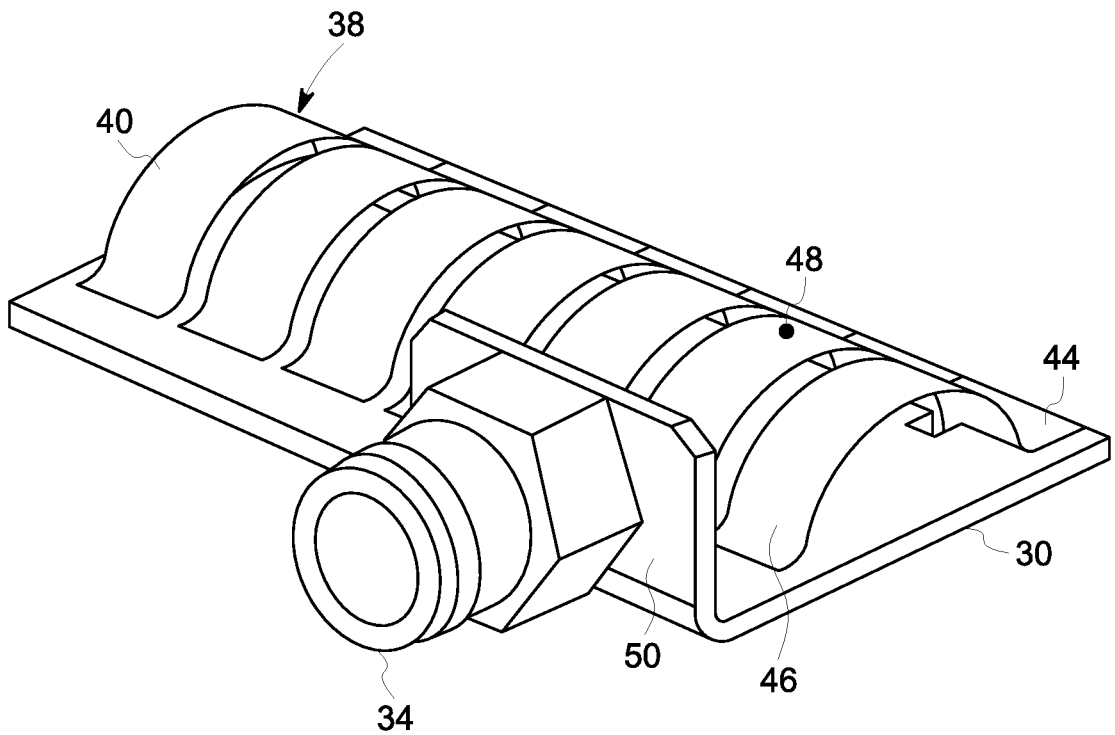

The first and second current contact member portions 30, 32 are assembled together so that the crests 48 of the first and second current contact members 38, 42 touch and slightly compress the fingers 40, as shown in FIG. 3a. Current is therefore able to flow from each current terminal 34, 36, through the corresponding current connector member portion 30, 32 and to the corresponding current contact member 38, 42.

In other embodiments of the invention, two or more of the current terminals 34, 36, the current connector member portions 30, 32 and/or the current contact members 38, 42 may be integrally formed with one another from a single piece of material (e.g. metal). For example, the first current terminal 34 and the first current connector member portion 30 may be integrally formed from a single piece of metal, and the second current terminal 36 and the second current connector member portion 32 may be integrally formed from another single piece of metal.

Returning to FIG. 1, the current transformer connector 10 includes a first current aperture 52 which contains the first set 26 of contacts. The current transformer connector 10 is made from a plastic material.

The current transformer connector 10 further includes second and third current apertures 54, 56 which each contain a corresponding second and third set 58, 60 of contacts. Each of the second and third sets 58, 60 includes current contact pairs 14, 20 as described hereinabove.

FIG. 1 shows only a portion of the current transformer connector 10, and so although not shown in FIG. 1, the current transformer connector 10 includes fourth, fifth and so on current apertures, each containing a corresponding set of contacts. The current transformer connector 10 may include a total of twelve current apertures, each containing corresponding current contact pairs. The apertures may include a mixture of current and voltage contact pairs, which is described in more detail below.

Each of the first, second, third, and so on sets 26, 58, 60 of current contact pairs 14, 20 may be connected to a different phase of the electrical network or may instead be connected at different locations of the same phase of the electrical network.

Although in the embodiment shown in FIG. 1 each set 26, 58, 60 of contacts has only one current aperture 52, 54, 56 (i.e. to form respective single current connections 62a, 62b, 62c), the current transformer connector 10 may include more than one current aperture 52, 54, 56 in each set 26, 58, 60. In other words, each row 26, 58, 60 of contacts shown in FIG. 1 may include more than one aperture 52, 54, 56 and therefore create more than one current connection slot in each row 26, 58, 60. In such an embodiment, each set 26, 58, 60 of contacts would include multiple, e.g. three, current connections 62a, 62b, 62c.

In a further embodiment, each set 26, 58, 60 of contacts includes a voltage aperture (not shown) containing a pair of voltage contacts, thus forming a voltage connection for connection to a voltage transformer. As such, each set 26, 58, 60 of contacts includes a mixture of current and voltage connections. For example, each set 26, 58, 60 of contacts may include two current connections 62a, 62b and one voltage connection or instead may include one current connection 62a and two voltage connections.

Figure 4:
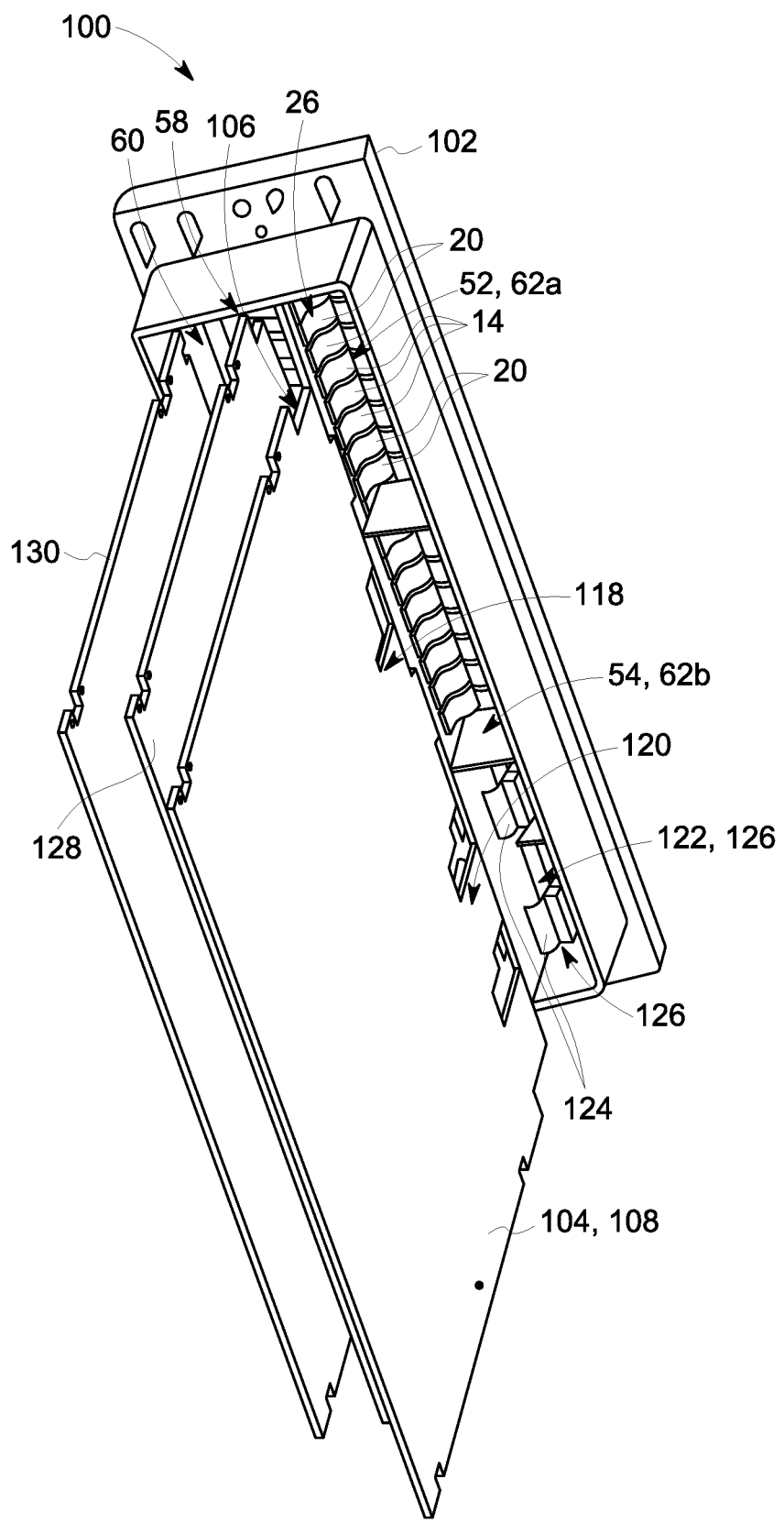
FIG. 4 shows a current transformer connection assembly according to a second embodiment of the invention.
Figure 5:
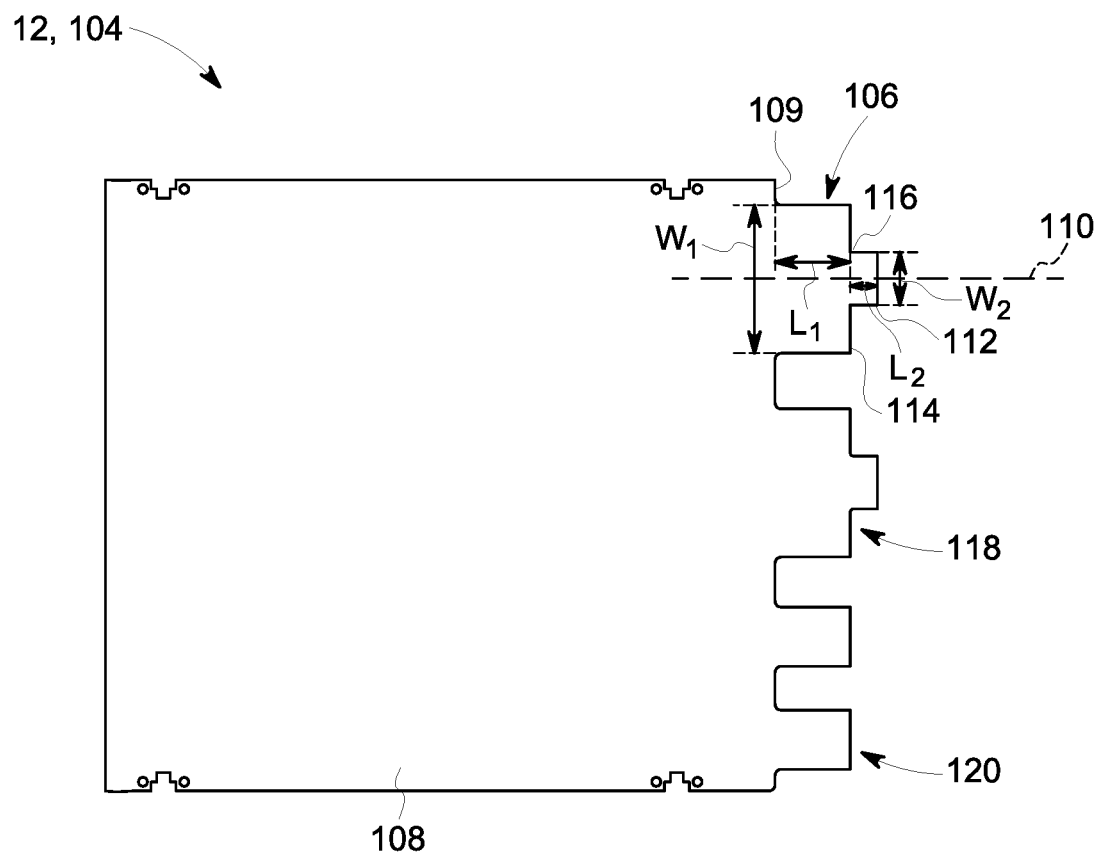
FIG. 5 shows a current transformer data acquisition board of the current transformer connection assembly shown in FIG. 4.

A current transformer connection assembly according to the second embodiment of the invention is shown in FIGS. 4 and 5 and is designated generally by reference number 100.

The current transformer connection assembly 100 includes a current transformer connector 102 which shares some of the same features as the current transformer connector 10 of the first embodiment, and like features share the same reference numeral.

The current transformer connection assembly 100 further includes a first current transformer data acquisition board 104.

The first current transformer data acquisition board 104 includes a first current channel member 106 that is arranged to be selectively inserted into the current transformer connector 102. In particular, the first current channel member 106 is arranged to be selectively inserted into the first current aperture 52 of the current transformer connector 102.

The first current channel member 106 is shaped so that during initial insertion of the first current channel member 106 into the first current aperture 52 the current channel member 106 separates the current contacts 16, 18 of the first current contact pairs 14 from one another, in particular urges the current contacts 16, 18 away from one another, to break the short circuit configuration of the first current contact pairs 14 and make an electrical connection between the first current contact pairs 14 and the current channel member 106, while the second current contact pairs 20 remain in the short circuit configuration.

The first current channel member 106 is further shaped so that during further insertion of the first current channel member 106 into the first current aperture 52 the first current channel member 106 separates the current contacts 22, 24 of the second current contact pairs 20 from one another, in particular urges the current contacts 22, 24 away from one another, to break the short circuit configuration of the second current contact pairs 20.

The first current channel member 106 is also arranged to be selectively removed from the first current aperture 52 and, in such removing, the first current channel member 106 is shaped so that during initial removal the current contacts 22, 24 of the second current contact pairs 20 return to the short circuit configuration while the current contacts 16, 18 of the first current contact pairs 14 remain in electrical connection with the current channel member 106. The first current channel member 106 is also shaped so that during further removal of the first current channel member 106 from the first current aperture 54 the current contacts 16, 18 of the first current contact pairs 14 return to the short circuit configuration.

The first current transformer data acquisition board 104 is described in more detail below with reference to FIG. 5.

The first current transformer data acquisition board 104 is in the form of a printed circuit board (PCB) 108, but in other embodiments it may take a different form.

The first current channel member 106 extends from an edge 109 of the PCB 108 and lies in the same plane as the PCB 108.

The first current channel member 106 is symmetrical about the centre line 110 of the first current channel member 106.

In the embodiment shown, the first current channel member 106 includes first and second current channel member portions 112, 114. The first and second current channel member portions 112, 114 are positioned relative to one another so that the first current channel member portion 112 enters first into the current aperture 54 during initial insertion of the PCB 108 and so that the second current channel member portion 114 enters second into the current aperture 54 during further insertion of the PCB 108.

More specifically, the first current channel member portion 112 extends from the edge 109 of the PCB 108 by a first amount and the second current channel member portion 114 extends from the edge 109 of the PCB 108 by a second amount, the first amount being larger than the second amount. As such, the first current channel member portion 112 protrudes further from the edge 109 of the PCB 108 than the second current channel member portion 114.

The second current channel member portion 114 extends from the edge 109 of the PCB 108 by a length $L_1$ and a width $W_1$, while the first current channel member portion 112 extends from the second current channel member portion 114 by a length $L_2$ and a width $W_2$.

In the embodiment shown, the length $L_1$ and width $W_1$ of the second current channel member portion 114 are larger than the length $L_2$ and width $W_2$ of the first current channel member portion 112.

The first current channel member portion 112 extends at a centre portion 116 of the second current channel member portion 114, i.e. from a centre of the width $W_1$ of the second current channel member portion 114. The first current channel member portion 112 may instead extend from either side of the centre portion 116 of the second current channel member portion 114. Alternatively, the first current channel member 106 may include two first current channel member portions 112, each extending from either side of the centre portion 116 of the second current channel member portion 114.

The first current channel member 106 includes current connection poles (not shown) on opposite faces of the PCB 108.

The PCB 108 includes a second current channel member 118 spaced from the first current channel member 106. The second current channel member 118 is identical to the first current channel member 106.

The PCB 108 further includes a voltage channel member 120 which is arranged to be inserted into a voltage aperture of the voltage transformer connector 102, as described in more detail below.

Moreover, the PCB 108 includes heavy copper outer layers (>1 oz, for example) and local hard-gold plating in the areas where the first and second current contact pairs 14, 20 will come into contact with the PCB 108.

Returning to FIG. 4, the current transformer connector 102 differs from that of the first embodiment in that the first set 26 of contacts includes first and second current apertures 52, 54 and a voltage aperture 122. The first and second current aperture 52, 54 each include current contact pairs 14, 20 as described in relation to the first embodiment of the invention, thus forming respective current connections 62a, 62b. Meanwhile, the voltage aperture 122 includes a pair of voltage contacts 124 (which are connectable to a voltage transformer), thus forming a voltage connection 126.

The current transformer connector 102 further includes second and third sets 58, 60 of contacts, each set 58, 60 also including two current connections 62a, 62b and a single voltage connection 126.

It will be understood that in other embodiments, each set 26, 58, 60 of contacts may include only current connections 62a, 62b, 62c, or another ratio of current and voltage connections 62a, 62b, 62c, 126.

The current transformer connection assembly 100 further includes second and third current transformer data acquisition boards 128, 130 each of which shares the same features as the first current transformer data acquisition board 104. The second current transformer data acquisition board 128 is arranged to be inserted into the second set 58 of contacts, and the third current transformer data acquisition board 130 is arranged to be inserted into the third set 60 of contacts.

The current transformer data acquisition boards 104, 128, 130 are shaped to include current and voltage channel members 106, 120 required to insert into the corresponding combination of current and voltage apertures 52, 54, 56, 122 in a given set 26, 58, 60 of contacts.

It will be appreciated that at least one embodiment of a given aspect of the invention may also be used in combination with at least one embodiment of the other aspects of the invention.

In use, each of the current connections 62a, 62b is connected to a respective current transformer (not shown) of an electrical network via each current terminal 34, 36. The first and second current contact pairs 14, 20 are in the short circuit configuration so that current is able to flow through the current contact pairs 14, 20 via the first and second current connector member portions 30, 32. In other embodiments of the invention, the current connections 62a, 62b may be connected to the same current transformer.

The first current transformer data acquisition board 104 is inserted into the current transformer connector 102. In particular, the first and second current channel members 106, 118 are inserted into the first and second current apertures 52, 54 and the voltage channel member 120 is inserted into the voltage aperture 122.

Focusing on the first current channel member 106, upon initial insertion of the first current transformer data acquisition board 104, the first current channel member portion 112 enters the current aperture 52 first and pushes through the first current contact pairs 14, thus urging the first and second current contacts 16, 18 of the first current contact pairs 14 away from one another to break their short circuit configurations. Meanwhile, because of the extra length $L_2$ of the first current channel member portion 112 compared to the length of $L_1$ of the second current channel member portion 114, the second current contact pairs 20 remain in their short circuit configurations.

Since the first and second current contacts 16, 18 of the first current contact pairs 14 are biased towards one another, they are each deflected by the first current channel member portion 112 but continue to push towards one another. This means that the current contacts 16, 18 of the first current contact pairs 14 establish good contact with the first current transformer data acquisition board 104 so as to make an electrical connection with the first current transformer data acquisition board 104 (i.e. via the gold plating areas of the PCB 108).

Next, as the first current transformer data acquisition board 104 is further inserted, the second current channel member portion 114 enters further into the current aperture 52 and pushes through the second current contact pairs 20, thus urging the first and second current contacts 22, 24 of the second current contact pairs 20 away from one another to break their short circuit configurations. None of the current contact pairs 14, 20 is now in the short circuit configuration.

Since the first and second current contacts 22, 24 of the second current contact pairs 20 are biased towards one another, they are each deflected by the second current channel member portion 114 but continue to push towards one another. This means that the current contacts 22, 24 of the second current contact pairs 20 establish good contact with the first current transformer data acquisition board 104 so as to make an electrical connection with the first current transformer data acquisition board 104 (i.e. via the gold plating areas of the PCB 108).

Therefore, all of the current contact pairs 14, 20 of the first current connection 62a are in electrical connection with the first current transformer data acquisition board 104.

The same insertion occurs with respect to the second current channel member 118 and the second current aperture 54, such the all the current contact pairs 14, 20 of the second current connection 62b are in electrical connection with the first current transformer data acquisition board 104.

The voltage channel member 120 is inserted into the voltage aperture 122 so as to make electrical connection with the voltage contacts 124.

The current transformer data acquisition board 104 includes current and voltage sensors (not shown) which are in turn connected to a protection relay (not shown).

Current is therefore able to flow from the electrical network, via each current transformer, through the current contact pairs 14, 20 to the protection relay. Voltage is also able to flow from the electrical network, via the voltage transformer, through the voltage contacts 124 to the protection relay. The protection relay is then able to protect a section of the electrical network based on the current and voltage measurements of the current and voltage transformers.

It may be necessary to remove a current transformer data acquisition board 104 from the current transformer connector 102, e.g. due to maintenance of the current transformer data acquisition board 104 being required.

In such a circumstance, the current transformer data acquisition board 104 is pulled out from the current transformer connector 102. During the initial removal of the current transformer data acquisition board 104, the second current channel member portion 114 is extracted first out of the current contact pairs 20 such that the first and second current contacts 22, 24 of the second current contact pairs 20 return back to their short circuit configuration via their biasing towards one another.

During the further removal of the current transformer data acquisition board 104, the first current channel member portion 112 is then extracted out of the current contact pairs 14 such that the first and second current contacts 16, 18 of the first current contact pairs 14 return back to their short circuit configuration via their biasing towards one another.

The current transformer data acquisition board 104 is therefore fully removed from the current transformer connector 102 and all of the current contact pairs 14, 20 are in their short circuit configuration.

The figures are not necessarily to scale, and certain features and certain views of the figures may be shown exaggerated in scale or in schematic form in the interests of clarity and conciseness.

The invention claimed is:

1. A current transformer connector for connecting a current transformer of an electrical network to a protection relay via a current transformer data acquisition board, the current transformer connector comprising:
    first and second pairs of first and second current contacts, each current contact pair being connectable in use to the current transformer so as to permit current flow from the electrical network through the current contact pairs to the protection relay,
    wherein each current contact pair is arranged to be in a short circuit configuration, and
    wherein the first current contact in each current contact pair is arranged to be independently moveable relative to the corresponding second current contact so that during initial insertion of the current transformer data acquisition board into the current transformer connector in use the first current contact of the first current contact pair is configured to separate from the second current contact of the first current contact pair to permit breaking of the short circuit configuration of the first current contact pair and making an electrical connection between the first current contact pair and the current transformer data acquisition board while the second current contact pair remains in the short circuit configuration, and so that during further insertion of the current transformer data acquisition board into the current transformer connector in use the first current contact of the second current contact pair is configured to separate from the second current contact of the second current contact pair to permit breaking of the short circuit configuration of the second current contact pair.

2. The current transformer connector according to claim 1 wherein the first current contact in each current contact pair is arranged to be independently moveable relative to the corresponding second current contact so that during initial removal of the current transformer data acquisition board from the current transformer connector in use the first current contact of the second current contact pair is configured to return to the short circuit configuration while the first current contact pair remains in electrical connection with the current transformer data acquisition board, and so that during further removal of the current transformer data acquisition board from the current transformer connector in use the first current contact of the first current contact pair is configured to return to the short circuit configuration.

3. The current transformer connector according to claim 1 wherein the first current contact in each current contact pair is biased towards the corresponding second current contact so that the first and second current contacts in each current contact pair are in contact with one another in the short circuit configuration.

4. The current transformer connector according to claim 3 wherein the second current contact in each current contact pair is biased towards the corresponding first current contact.

5. The current transformer connector according to claim 1 wherein the first current contact in the first current contact pair is arranged to be urged away from and break contact with the corresponding second current contact so as to break the short circuit configuration during initial insertion of the current transformer data acquisition board into the current transformer connector in use and/or the first current contact in the second current contact pair is arranged to be urged away from and break contact with the corresponding second current contact so as to break the short circuit configuration of the second current contact pair during further insertion of the current transformer data acquisition board into the current transformer connector in use.

6. The current transformer connector according to claim 1 wherein the second current contact in each current contact pair is arranged to be independently moveable relative to the corresponding first current contact so that during the initial insertion of the current transformer data acquisition board the second current contact of the first current contact pair is configured to separate from the first current contact of the first current contact pair to permit breaking of the short circuit configuration of the first current contact pair and making of an electrical connection between the first current contact pair and the current transformer data acquisition board while the second current contact pair remains in the short circuit configuration, and so that during the further insertion of the current transformer data acquisition board the second current contact of the second current contact pair is configured to separate from the first current contact of the second current contact pair to permit breaking of the short circuit configuration of the second current contact pair.

7. The current transformer connector according to claim 1 wherein the first current contact in the second current contact pair is arranged to be independently moveable relative to the corresponding second current contact so that the first current contact in the second current contact pair makes an electrical connection between the second current contact pair and the current transformer data acquisition board during the further insertion of the current transformer data acquisition board.

8. The current transformer connector according to claim 1 including a plurality of first current contact pairs and/or a plurality of second current contact pairs.

9. The current transformer connection assembly for connecting a current transformer of an electrical network to a protection relay, the current transformer connection assembly comprising:
   the current transformer connector according to claim 1; and
   the current transformer data acquisition board including a current channel member arranged to be selectively inserted into the current transformer connector to permit, in use, current flow from the electrical network through the current channel member to the protection relay, the current channel member further being shaped so that during initial insertion of the current channel member into the current transformer connector the current channel member separates the first current contact of the first current contact pair from the second current contact of the first current contact pair to break the short circuit configuration of the first current contact pair and make an electrical connection between the first current contact pair and the current channel member while the second current contact pair remains in the short circuit configuration, and so that during further insertion of the current channel member into the current transformer connector the current channel member separates the first current contact of the second current contact pair from the second current contact of the second current contact pair to break the short circuit configuration of the second current contact pair.

10. The current transformer connection assembly according to claim 9 wherein the current channel member is arranged to be selectively removed from the current transformer connector, the current channel member being shaped so that during initial removal of the current channel member from the current transformer connector the first current contact of the second current contact pair returns to the short circuit configuration while the first current contact pair remains in electrical connection with the current channel member, and so that during further removal of the current channel member from the current transformer connector the first current contact of the first current contact pair returns to the short circuit configuration.

11. The current transformer connection assembly (100) according to claim 9 wherein the current channel member is shaped to urge the first current contact in the first current contact pair away from and break contact with the corresponding second current contact so as to break the short circuit configuration during the initial insertion of the current channel member and the current channel member is shaped to urge the first current contact in the second current contact pair away from and break contact with the corresponding second current contact so as to break the short circuit configuration during the further insertion of the current channel member.

12. The current transformer connection assembly according to claim 9 wherein the current channel member extends from an edge of the current transformer data acquisition board and lies in the same plane as the current transformer data acquisition board.

13. The current transformer connection assembly according to claim 9 wherein the current channel member is symmetrical about the centre line of the current channel member.

14. The current transformer connection assembly according to claim 9 wherein the current channel member includes first and second current channel member portions positioned relative to one another so that the first current channel member portion enters first into the current transformer connector during the initial insertion so as to break the short circuit configuration of the first current contact pair and make the electrical connection between the first current contact pair and the current channel member, and so that the second current channel member portion enters second into the current transformer connector during the further insertion so as to break the short circuit configuration of the second current contact pair.

15. The current transformer connection assembly according to claim 14 wherein the first current channel member portion extends from the second current channel member portion at a centre portion of the second current channel member portion.

\* \* \* \* \*